United States Patent [19]
Kusuda et al.

[11] Patent Number: 5,568,252
[45] Date of Patent: Oct. 22, 1996

[54] METHOD AND APPARATUS FOR MEASURING INSULATION FILM THICKNESS OF SEMICONDUCTOR WAFER

[75] Inventors: Tatsufumi Kusuda; Motohiro Kouno; Ikuyoshi Nakatani; Sadao Hirae, all of Kyoto, Japan

[73] Assignee: Dainippon Screen Manufacturing Co., Ltd., Japan

[21] Appl. No.: 363,535

[22] Filed: Dec. 23, 1994

[30] Foreign Application Priority Data

Dec. 28, 1993 [JP] Japan .................................. 5-350500

[51] Int. Cl.$^6$ ............................. G01N 21/00; G01B 11/06
[52] U.S. Cl. ........................... 356/72; 324/765; 324/73.1; 324/96; 356/381; 250/559.27
[58] Field of Search ............................. 356/72, 381, 382, 356/357; 324/765, 73.1, 96; 250/559.27

[56] References Cited

U.S. PATENT DOCUMENTS

| 4,909,631 | 3/1990 | Tan et al. ................................. 356/382 |
| 5,233,291 | 8/1993 | Kouno et al. ............................ 324/765 |

OTHER PUBLICATIONS

C. J. Dell'Oca, "Nondestructive Thickness Determination of Polycrystalline Silicon Deposited on Oxidized Silicon", *J. Electrochem. Soc.: Solid–State Science and Technology*, Jan. 1972, pp. 108–111.

Primary Examiner—K. Hantis

[57] ABSTRACT

Reflectance measurement with two monochromatic light beams having different wavelengths is used to obtain curves respective representing the relationship between an insulation film thickness of a semiconductor wafer and the gap between a test electrode and a semiconductor wafer surface. The C-V curve measurement at a fixed gap determines a total capacity of the gap and the insulation film, and a straight line representing the relationship between the gap and the insulation film thickness is obtained from the total capacity. An intersection where the two curves and the straight line cross gives the true values of the gap and the insulation film thickness. Other possible methods include: one for executing the C-V curve measurement and the reflectance measurement with two linear polarized light beams having identical wavelengths but different polarization directions; one for executing the reflectance measurement with three monochromatic light beams that differ in at least wavelength and/or polarization direction; and one for executing the reflectance measurement and the C-V curve measurement for two different gaps.

12 Claims, 10 Drawing Sheets

| | dox(nm) | dair(nm) |
|---|---|---|
| P1: | 90.0 | 320.0 |
| P2: | 212.3 | 166.5 |
| P3: | 446.0 | 295.6 |
| P4: | 603.2 | 169.2 |
| P5: | 853.3 | 220.0 |
| P6: | 942.7 | 230.7 |

$$Ct = \frac{Cair\,Cox}{Cair + Cox}$$

$$\text{REFLECTANCE AT BK7/AIR INTERFACE } R_{01} = \frac{r_0 + R_{12} \exp(j\delta_1)}{1 + r_0 R_{12} \exp(j\delta_1)}$$

$$\text{REFLECTANCE AT AIR/SiO}_2 \text{ INTERFACE } R_{12} = \frac{r_1 + r_2 \exp(j\delta_2)}{1 + r_1 r_2 \exp(j\delta_2)}$$

$$\delta_1 = \frac{4\pi}{\lambda} \dot{n}_1 \, ds \cos\theta_1$$

$$\delta_2 = \frac{4\pi}{\lambda} \dot{n}_2 \, dox \cos\theta_2$$

Fig. 7

|     | dox(nm) | dair(nm) |
|-----|---------|----------|
| P1: | 90.0    | 320.0    |
| P2: | 212.3   | 166.5    |
| P3: | 446.0   | 295.6    |
| P4: | 603.2   | 169.2    |
| P5: | 853.3   | 220.0    |
| P6: | 942.7   | 230.7    |

Fig. 8

| | dox(nm) | dair(nm) |
|---|---|---|
| P1: | 90.0 | 320.0 |
| P2: | 212.3 | 166.5 |
| P3: | 446.0 | 295.6 |
| P4: | 603.2 | 169.2 |
| P5: | 853.3 | 220.0 |
| P6: | 942.7 | 230.7 |

METHOD AND APPARATUS FOR MEASURING INSULATION FILM THICKNESS OF SEMICONDUCTOR WAFER

BACKGROUND OF THE INVENTION

1. Field of the Invention

The present invention relates to a method of and an apparatus for measuring thickness of an insulation film on the surface of a semiconductor wafer, and more specifically to making the thickness measurement with a non-destructive measuring device.

2. Description of the Related Art

Measurement of the C-V curves is one of known methods used for evaluating semiconductors having an MIS (Metal-Insulator-Semiconductor) structure. In conventional C-V measurement, a test electrode is to be formed on the surface of an insulation film on a semiconductor wafer. Formation of the test electrode, however, affects electric properties of the semiconductor wafer and furthermore takes both labor and time. As a result of extensive study, the inventors of the present invention have developed a novel non-destructive measuring device for evaluating electric properties of semiconductor wafers including C-V and C-t curves without forming any test electrode on the surface of the semiconductor wafers.

Figures 1A, 1B:
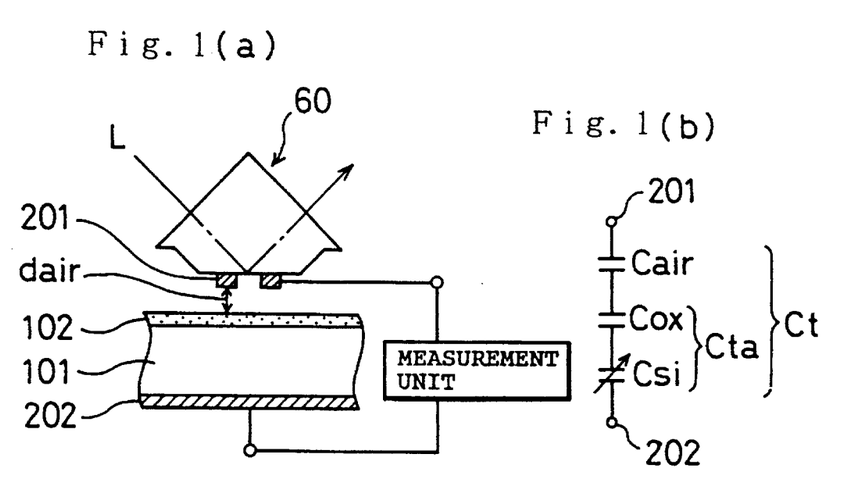
FIGS. 1(a) and 1(b) are respective structural and electrical schematics which show features of a non-destructive measuring device for semiconductors.
Figure 1C:
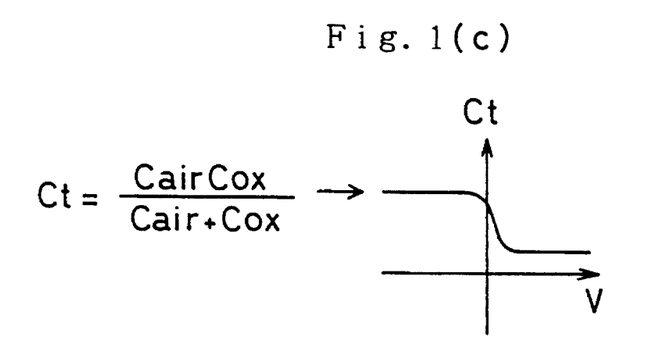
FIG. 1(c) is a C-V characteristic curve

FIGS. 1(a) through 1(c) show some features of the non-destructive measuring device for semiconductors developed by the applicants. As shown in FIG. 1(a), an oxide film 102 is formed on a top surface of a semiconductor substrate 101. In measurement of C-V curves, an electrode 202 is electrically connected with a bottom surface of the semiconductor substrate 101, and a sensor head 60 having a test electrode 201 attached to a bottom surface thereof is held above the oxide film 102 via a gap $d_{air}$. The gap $d_{air}$ is adjusted to be not greater than about 1 μm.

A total electrostatic capacity $C_t$ between the two electrodes 201 and 202 is defined as a total of a capacity $C_{si}$ of the semiconductor substrate 101, another capacity $C_{ox}$ of the oxide film 102, and still another capacity $C_{air}$ of the gap $d_{air}$, which are connected in series. The C-V curve represents voltage dependency of a composite capacity $C_{ta}$ of the capacity $C_{si}$ of the semiconductor substrate 101 and the capacity $C_{ox}$ of the oxide film 102. The gap $d_{air}$ is first determined precisely based on the reflectance of a laser beam L reflected from the bottom surface of the sensor head 60 under the geometric-optical total reflection conditions. The electrostatic capacity $C_{air}$ of the gap $d_{air}$ is then calculated using the gap $d_{air}$ thus determined. The total capacity $C_t$ is measured, and the composite capacity $C_{ta}$ is finally obtained dependency of the composite capacity $C_{ta}$ is thus obtained. by subtracting the capacity $C_{air}$ of the gap $d_{air}$ from the total capacity $C_t$ previously measured. A C-V curve, or voltage dependency of the composite capacity $C_{ta}$ is thus obtained.

The gap $d_{air}$ is determined from the reflectance of the laser beam L as mentioned above, but precise determination of the gap $d_{air}$ requires consideration of multi-path reflection at the oxide film 102 on the surface of the semiconductor. Accordingly, for the precise determination of the gap $d_{air}$, the thickness of the oxide film 102 must be made. In the conventional method, the thickness of the oxide film 102 is measured with a thickness gauge prior to the determination of the gap $d_{air}$ using the non-destructive measuring device.

SUMMARY OF THE INVENTION

An object of the present invention is thus to measure thickness of an insulation film on the surface of a semiconductor wafer using a non-destructive measuring technique.

The present invention is directed to a method of measuring thickness of an insulation film formed on a surface of a semiconductor wafer. The method comprises the steps of: providing a non-destructive measuring device comprising a light source for generating a plurality of monochromatic light beams which differ at least in wavelength and/or polarization direction, an optical waveguide having a reflecting plane for reflecting the plurality of monochromatic light beams such that geometric optical total reflection of the plurality of monochromatic light beams occurs, a photosensor for measuring intensity of each of the plurality of monochromatic light beams reflected from the reflecting plane, and a test electrode proximate to the reflecting plane adapted to C-V characteristic measurement of the semiconductor wafer; holding the reflecting plane apart from the semiconductor wafer across a gap; emitting the plurality of monochromatic light beams from the light source, and measuring the intensity of each of the plurality of monochromatic light beams reflected from the reflecting plane to obtain reflectance of each of the plurality of monochromatic light beams; determining a plurality of characteristic curves respectively representing relationships between the thickness of the insulation film and the gap between the reflecting plane and the semiconductor wafer from the reflectance of the plurality of monochromatic light beams; measuring a C-V characteristic of the semiconductor wafer to obtain a total capacity of the gap and the insulation film; determining a characteristic line representing a relationship between the gap and the thickness of the insulation film from the total capacity; and finding a common intersection of the characteristic line and the plurality of characteristic curves to determine values of the gap and the thickness of the insulation film.

In the preferred embodiment, the step of emitting the plurality of monochromatic light beams comprises emitting two monochromatic light beams having different wavelengths. The step of emitting a plurality of monochromatic light beams comprises emitting two linear polarized light beams having different polarization directions.

Preferably, the two polarized light beams have orthogonal polarization directions. More preferably, the two polarized light beams are of the same.

The present invention is also directed to a method of measuring thickness of an insulation film formed on a surface of a semiconductor wafer, which method comprises of: providing a non-destructive measuring device comprising a light source for generating a plurality of monochromatic light beams which differ in at least wavelength and/or polarization direction, an optical waveguide having a reflecting plane for reflecting the plurality of monochromatic light beams such that geometric optical total reflection of the plurality of monochromatic light beams occurs, and a photosensor for measuring intensity of each of the plurality of monochromatic light beams reflected from the reflecting plane; maintaining a gap between from and the semiconductor wafer; emitting the plurality of monochromatic light beams from the light source, and measuring the intensity of each of the plurality of monochromatic light beams reflected from the reflecting plane to obtain reflectance of each of the plurality of monochromatic light beams; determining a plurality of characteristic curves respectively representing relationships between the thickness of the insulation film and the gap between the reflecting plane and the semiconductor wafer by utilizing the reflectance of the plurality of monochromatic light beams; and finding a common intersection of the plurality of characteristic curves to determine values of the gap and the thickness of the insulation film.

The present invention is further directed to a method of measuring a thickness of an insulation film formed on a surface of a semiconductor wafer, comprising the steps of: providing a non-destructive measuring device comprising a light source for generating a monochromatic light beam, an optical waveguide having a reflecting plane for reflecting the monochromatic light beam such that geometric optical total reflection of the monochromatic light beam occurs, a photosensor for measuring intensity of the monochromatic light beam reflected from the reflecting plane, and a test electrode proximate to the reflecting plane adapted to C-V characteristic measurement of the semiconductor wafer; holding the reflecting plane apart from the semiconductor wafer across a first gap; emitting the monochromatic light beam from the light source, and measuring the intensity of the monochromatic light beam reflected from the reflecting plane to obtain first reflectance of the monochromatic light beam; determining a first characteristic curve representing a relationship between the thickness of the insulation film and the first gap from the first reflectance of the monochromatic light beam; measuring a first C-V characteristic of the semiconductor wafer at the first gap to obtain a first total capacity of the first gap and the insulation film; determining a first characteristic line representing relationship between the first gap and the thickness of the insulation film from the first total capacity; the reflecting plane spaced from the semiconductor wafer across a second gap; emitting the monochromatic light beam from the light source, and measuring the intensity of the monochromatic light beam reflected from the reflecting plane to obtain second reflectance of the monochromatic light beam; determining a second characteristic curve representing a relationship between the thickness of the insulation film and the second gap by utilizing the second reflectance of the monochromatic light beam; measuring a second C-V characteristic of the semiconductor wafer at the second gap to obtain a second total capacity of the second gap and the insulation film; determining a second characteristic line representing a relationship between the second gap and the thickness of the insulation film by utilizing the second total capacity; finding a first intersection of the first characteristic line and the first characteristic curve, and a second intersection of the second characteristic line and the second characteristic curve, the first and second intersections indicating an identical value for the thickness of the insulation film, to thereby determine the value of the thickness of the insulation film.

The present invention is also directed to a non-destructive measuring apparatus for measuring a thickness of an insulation film formed on a surface of a semiconductor wafer. The apparatus comprises: a light source for generating a plurality of monochromatic light beams which differ in at least wavelength and polarization direction; an optical waveguide having a reflecting plane for reflecting the plurality of monochromatic light beams such that geometric optical total reflection of the plurality of monochromatic light beams occurs; maintaining a gap between means for holding the reflecting plane and the semiconductor wafer a photosensor for measuring intensity of each of the plurality of monochromatic light beams reflected from the reflecting plane to obtain reflectance of each of the plurality of monochromatic light beams; a test electrode proximate to the reflecting plane adapted to C-V characteristic measurement of the semiconductor wafer; means for determining a plurality of characteristic curves respectively representing relationships between the thickness of the insulation film and the gap between the reflecting plane and the semiconductor wafer by utilizing the reflectance of the plurality of monochromatic light beams; means for measuring a C-V characteristic of the semiconductor wafer to obtain a total capacity of the gap and the insulation film; means for utilizing total capacity to determine a characteristic line representing relationship between the gap and the thickness of the insulation film; and means for finding a common intersection of the characteristic line and the plurality of characteristic curves to determine values of the gap and the thickness of the insulation film.

The present invention is further directed to a nondestructive measuring apparatus for measuring a thickness of an insulation film formed on a surface of a semiconductor wafer comprising: a light source for generating a plurality of monochromatic light beams which differ in wavelength and/or polarization direction; an optical waveguide having a reflecting plane for reflecting the plurality of monochromatic light beams such that geometric optical total reflection of the plurality of monochromatic light beams occurs; holding means for holding the reflecting plane spaced from the semiconductor wafer by a gap a photosensor for measuring intensity of each of the plurality of monochromatic light beams reflected from the reflecting plane to obtain reflectance of each of the plurality of monochromatic light beams; means utilizing the reflectance of the plurality of monochromatic light beams for determining a plurality of characteristic curves respectively representing relationships between the thickness of the insulation film and the gap between the reflecting plane and the semiconductor wafer; and means for finding a common intersection of the plurality of characteristic curves to determine values of the gap and the thickness of the insulation film.

The present invention is also directed to a non-destructive measuring apparatus for measuring a thickness of an insulation film formed on a surface of a semiconductor wafer, comprising: a light source for generating a monochromatic light beam; an optical waveguide having a reflecting plane for reflecting the monochromatic light beam such that geometric optical total reflection of the monochromatic light beam occurs; holding means maintaining respective first and second gaps between for the reflecting plane and the semiconductor wafer a photosensor for measuring intensity of the monochromatic light beam reflected from the reflecting plane at the first and the second gaps, respectively, to obtain first reflectance of the monochromatic light beam for the first gap and second reflectance of the monochromatic light beam for the second gap; a test electrode proximate to the reflecting plane adapted to C-V characteristic measurement of the semiconductor wafer; means utilizing the first reflectance of the monochromatic light beam for determining a first characteristic curve representing a relationship between the thickness of the insulation film and the first gap and utilizing the second reflectance of the monochromatic light beam for determining a second characteristic curve representing relationship between the thickness of the insulation film and the second gap from; means for measuring a first C-V characteristic of the semiconductor wafer at the first gap to obtain a first total capacity of the first gap and the insulation film, and a second C-V characteristic of the semiconductor wafer at the second gap to obtain a second total capacity of the second gap and the insulation film; means utilizing the first total capacity for determining a first characteristic line representing a relationship between the first gap and the thickness of the insulation film, and utilizing the second total capacity for determining, a second characteristic line representing a relationship between the second gap and the thickness of the insulation film; and means for finding a first intersection of the first characteristic line and the first characteristic curve, and a second intersection of the second characteristic line and the second characteristic curve, the first and second intersections indicating an identical value of the thickness of the insulation film, to thereby determine the value of the thickness of the insulation film.

These and other objects, features, aspects, and advantages of the present invention will become more apparent from the following detailed description of the preferred embodiments with the accompanying drawings.

DESCRIPTION OF THE PREFERRED EMBODIMENT

A. Structure of Apparatus

Figure 2:
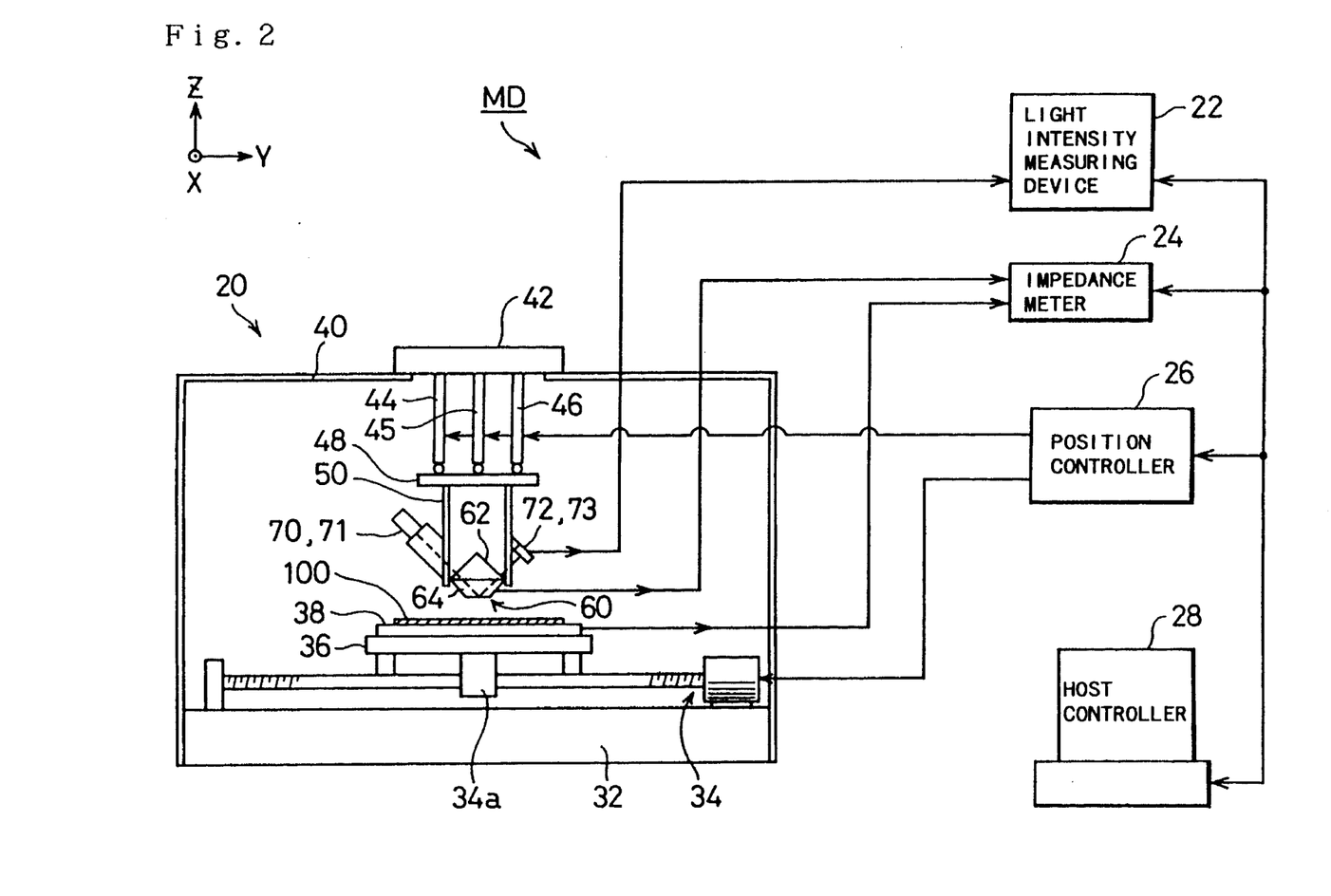
FIG. 2 illustrates the structure of a non-destructive measuring device MD embodying the present invention.

FIG. 2 illustrates a non-destructive measuring apparatus MD embodying the present invention. The measuring apparatus MD comprises a testing unit 20, a light-intensity measuring device 22, an impedance meter 24, a position controller 26, and a host controller 28. The intensity measuring device 22, the impedance meter 24, and the position controller 26 are connected to the host controller 28 such as a personal computer, which controls the whole apparatus and performs processing of measured data transmitted from the devices 22, 24, and 26.

The testing unit 20 includes a base 32, a driving unit 34 mounted on the base 32, a stand 36 engaged with a ball thread 34a of the driving unit 34, and a sample table 38 disposed on the stand 36. The sample table 38, which is an X-Y plane, supports the semiconductor wafer 100 mounted thereon as a sample and is driven by a motor (not shown) to rotate.

A flange 42 is bolted to an upper opening of a casing 40 of the testing unit 20, and three piezoelectric actuators 44, 45, and 46 are arranged below the flange 42 in a triangle formation. A support plate 48 is engaged under the three piezoelectric actuators 44, 45, and 46, and a sensor head 60 is fixed near the bottom end of a support cylinder 50 extending under the support plate 48. The support plate 48 is linked with the flange 42 by means of a plurality of springs (not shown) so that the piezoelectric actuators 44, 45, and 46 are pressed between the plate 48 and the flange 42. The sensor head 60 includes a rectangular prism 62 for transmitting a laser beam and a transparent electrode mount 64 which is fixed to the bottom surface of the rectangular prism 62 with an optical adhesive.

A pair of laser sources 70 and 71 such as a GaAlAs laser, and a pair of photosensors 72 and 73 such as a photo diode, are fixed respectively to the opposite side faces of the support cylinder 50.

Laser beam emitted from the two laser sources 70 and 71 respectively pass through the rectangular prism 62 to enter the electrode mount 64 and are reflected from a bottom face of the electrode mount 64 under geometric-optical total reflection conditions. The reflected laser beams pass through the rectangular prism 62 again to be received by the photosensors 72 and 73, respectively.

In measuring the electrical characteristics of the semiconductor wafer 100, a bottom surface of the sensor head 60 is spaced from the surface of the semiconductor wafer 100 across a gap of no more than about one micrometer. An optical measuring system including the laser sources 70 and 71, the sensor head 60, and the photosensors 72 and 73 precisely and accurately measures the gap by utilizing evanescent light reflected from the bottom surface of the sensor head 60 under geometric-optical total reflection conditions. The detailed method of measuring the gap are described in U.S. Pat. No. 5,233,291, the disclosure of which is incorporated by reference herein.

The three piezoelectric actuators 44, 45, and 46 are controlled by the position controller 26 to move the sensor head 60 in the Z direction and further to make the bottom surface of the sensor head 60 substantially parallel to the semiconductor wafer 100.

The photosensors 72 and 73 are connected to the intensity measuring device 22, and the impedance meter 24 is connected to electrodes formed on the bottom surface of the sensor head 60 as well as to the metal sample table 38. The impedance meter 24 measures a capacitance or a conductance between the electrode on the bottom surface of the sensor head 60 and the sample table 38.

B. Basic Structure of Electrode Mount 64

Figure 3A:
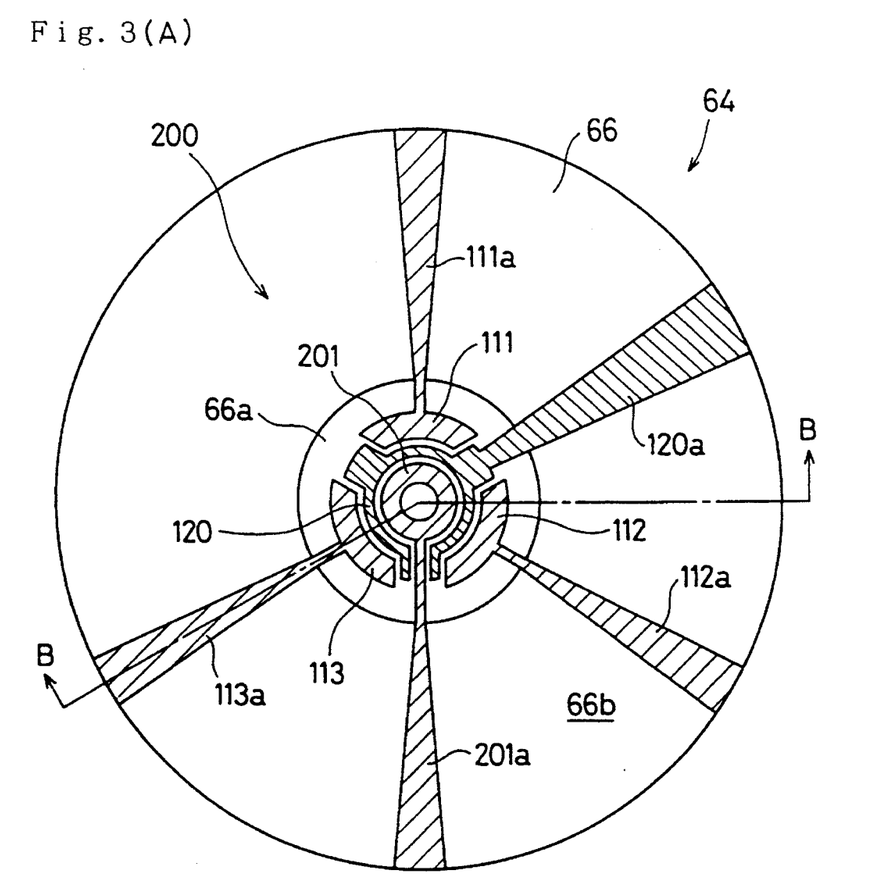
FIG. 3(A) is a bottom view showing the electrode mount 64 in the device of FIG. 2.
Figure 3B:
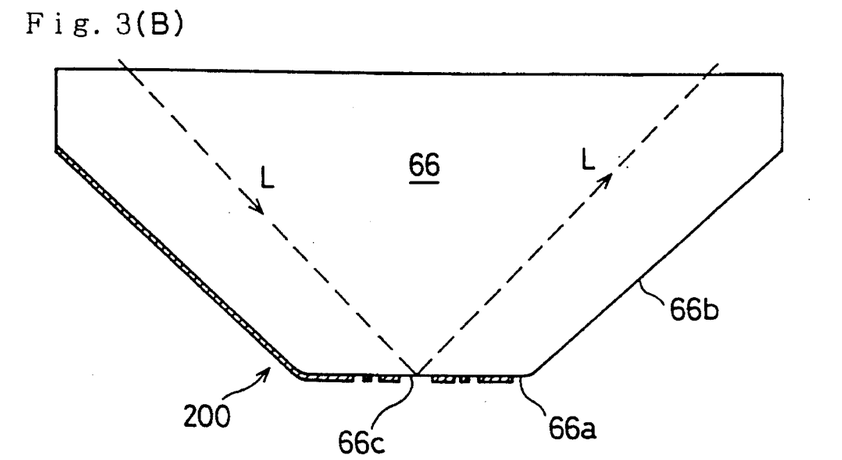
FIG. 3(B) is a cross sectional view of the electrode mount 64 taken on the line B—B of FIG. 3(A)

FIG. 3(A) is a bottom view of the electrode mount 64, and FIG. 3(B) is a cross sectional view of the electrode mount 64 taken on the line B—B of FIG. 3(A). The electrode mount 64 is constituted by: a cone glass 66 made of optical glass having a shape of an inverted truncated cone; and an electrode pattern 200 formed on a bottom surface 66a of the cone glass 66. The electrode pattern 200 includes a test electrode 201, three parallelism adjustor electrodes 111 through 113, a guard ring 120, and wires 201a, 111a, 112a, 113a, and 120a respectively connected to the electrodes 201, 111, 112, 113, and 120. These wires extend from the bottom surface 66a to cross over the inclined face 66b of the cone glass 66. The cone glass 66 is prepared by polishing and tapering a side wall of disk-shaped glass. Since the cone glass 66 has the bottom surface 66a and a top surface parallel to each other, the electrode pattern 200 can be easily formed on the bottom surface 66a by photo lithography. The electrode pattern 200 can be covered with a transparent insulating layer, which is made of silicon dioxide or silicon nitride, for example, to increase the dielectric breakdown strength of the sensor head, if necessary.

The test electrode 201 has a ring shape having a circular opening in its center. The cone glass surface in the center of the electrode 201 forms a reflecting plane 66c which reflects a laser beam L under geometric optical total reflection conditions. In this embodiment, the test electrode 201 has an inner diameter of 0.5 mm and an outer diameter of 1.0 mm.

The three parallelism adjustor electrodes 111 through 113 have an identical arc shape divided from a certain ring. The electrodes 111 through 113 are used for adjusting parallelism between the bottom surface 66a of the cone glass 66 and the surface of the semiconductor wafer 100. More concretely, a slope of the bottom surface 66a of the cone glass 66 is adjusted so as to make capacities of electrodes 111, 112, 113 equal to each other, by controlling the piezoelectric actuators 44, 45, and 46. The bottom surface 66a of the cone glass 66 is thereby made parallel to the surface of the semiconductor wafer 100.

The guard ring 120 is an ring electrode disposed between the test electrode 201 and the parallelism adjustor electrodes 111 through 113. The guard ring 120 is kept to have a predetermined electric potential (for example, ground potential) to prevent interactions between the four electrodes 201 and 111 through 113. The guard ring 120 makes the capacitance measurement by the test electrode 201 free from any influences of the parallelism adjustor electrodes 111 through 113. This significantly improves precision of the electric characteristics measurement. The guard ring 120 also makes the capacitance measurement of each parallelism adjustor electrode 111, 112, or 113 free from influences of the other parallelism adjustor electrodes, and thereby the parallelism between the bottom surface 66a of the cone glass 66 and the surface of the semiconductor wafer 100 can be adjusted with higher precision.

Each gap between the electrodes 201 and 111 through 113, and between the electrodes 111 through 113 and the guide ring 120 is 0.1 mm. The width of each wiring 201a, 111a through 113a on the bottom surface 66a is 0.1 mm.

Figure 4A:
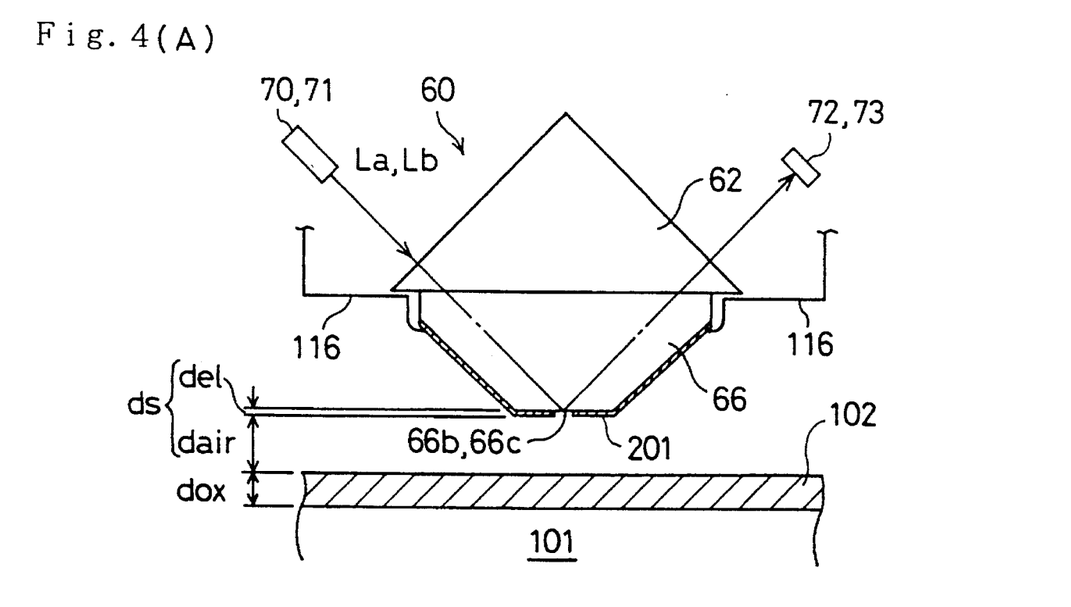
FIG. 4(A) is a cross sectional view illustrating relative positions of s sensor head 60, laser generators 70,71, and photo-sensors 72,73 in the device of FIG. 2.
Figure 4B:
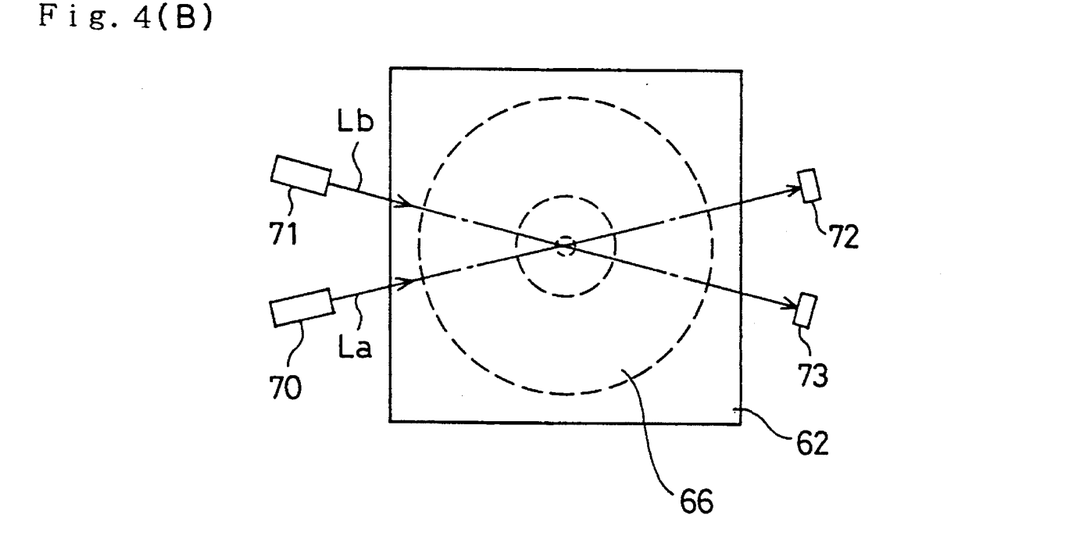
FIG. 4(B) is a plan view of FIG. 4(A)

FIG. 4(A) is a cross sectional view illustrating relative positions of the sensor head 60, the laser generators 70,71, and the photo-sensors 72,73, and FIG. 4(B) is a plan view illustrating the same. Laser beams La and Lb emitted from the laser generators 70,71 respectively are reflected from the reflecting plane 66c at the center of the bottom surface 66a of the cone glass 66 and received by the photo-sensors 72,73. As shown in FIG. 4(A), a distance $d_s$ between the surface of an oxide film 102 and the reflecting plane 66c of the cone glass 66 is the sum of a distance $d_{air}$ between the oxide film 102 and the test electrode 201 and a thickness $d_{el}$ of the test electrode 201. The distance $d_s$ is determined according to the reflectance of the laser beams as described later while the gap capacity $C_{air}$ included the total capacity $C_t$ (FIG. 1(b)), which is determined by the C-V curve measurement, depends upon the distance $d_{air}$. The thickness $d_{el}$ of the test electrode 201 can be measured in advance, and the two distances $d_{air}$ and $d_s$ can be related to each other by the thickness $d_{el}$ accordingly.

Incidentally, the wirings 111a through 113a, 120a, and 201a on the cone glass 66 are connected to lead wires 116 at the end of the inclined surface 66b of the cone glass 66.

C. Measurement of Oxide Film Thickness

In this embodiment, the following two relationships are used in determining a thickness $d_{ox}$ of the oxide film 102: (1) relationship between the oxide film thickness $d_{ox}$ and the gap $d_{air}$ obtained by a C-V curve measurement; and (2) relationship between the oxide film thickness $d_{ox}$ and the gap $d_{air}$ obtained through measurement of the reflectance of a laser beam. These two relationships are described below first, which is followed by concrete examples of determination of the oxide film thickness based on these relationships.

C-1. Relationship between $d_{ox}$, and $d_{air}$ obtained by C-V curve measurement As shown in FIG. 1(c), in the accumulation state of a C-V curve (at the left end of the graph), the total capacity $C_t$ is substantially equal to the composite capacity of the gap capacity $C_{air}$ and the oxide film capacity $C_{ox}$ connected in series. This means that the following Equation (1) holds in the accumulation state:

$$\frac{1}{C_t} = \frac{1}{C_{air}} + \frac{1}{C_{ox}} \tag{1}$$

The capacity $C_{air}$ of the gap $d_{air}$ and the capacity $C_{ox}$ of the oxide film 102 are expressed as:

$$C_{air} = \frac{\epsilon_0 S}{d_{air}} \tag{2a}$$

$$C_{ox} = \frac{\epsilon_0 \epsilon_{ox} S}{d_{ox}} \tag{2b}$$

in which S, $\epsilon_0$ and $\epsilon_{ox}$ respectively denote the area of the test electrode 201, the dielectric constant of the air, and the dielectric constant of the oxide film 102.

Substitution of Equations (2a) and (2b) in Equation (1) provides the following Equation (3), which shows the relationship between the gap $d_{air}$ and the oxide film thickness $d_{ox}$:

$$d_{air} = \frac{\epsilon_0 S}{C_t} - \frac{1}{\epsilon_{ox}} d_{ox} \tag{3}$$

Figure 5:
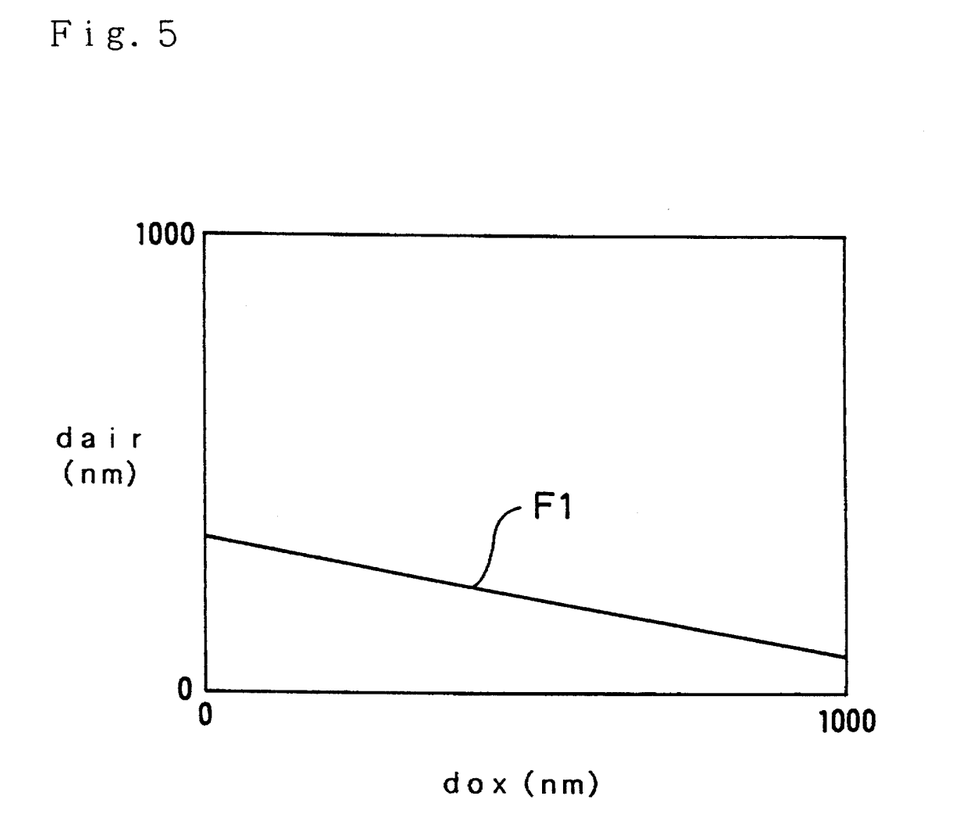
FIG. 5 is a graph showing the relationship between an oxide film thickness $d_{ox}$ and the gap $d_{air}$ determined through measurement of the total capacity $C_t$.

In Equation (3), the dielectric constants $\epsilon_0$ and $\epsilon_{ox}$ are known values whereas the area S of the test electrode 201 is previously measured. Substitution of the total capacity $C_t$, measured in the accumulation state of the C-V curve, in Equation (3) gives the linear relationship between the gap $d_{air}$ and the oxide film thickness $d_{ox}$. FIG. 5 is a graph showing a straight line F1 representing the relationship between the oxide film thickness $d_{ox}$ and the gap $d_{air}$ determined through measurement of the total capacity $C_t$.

Figure 6:
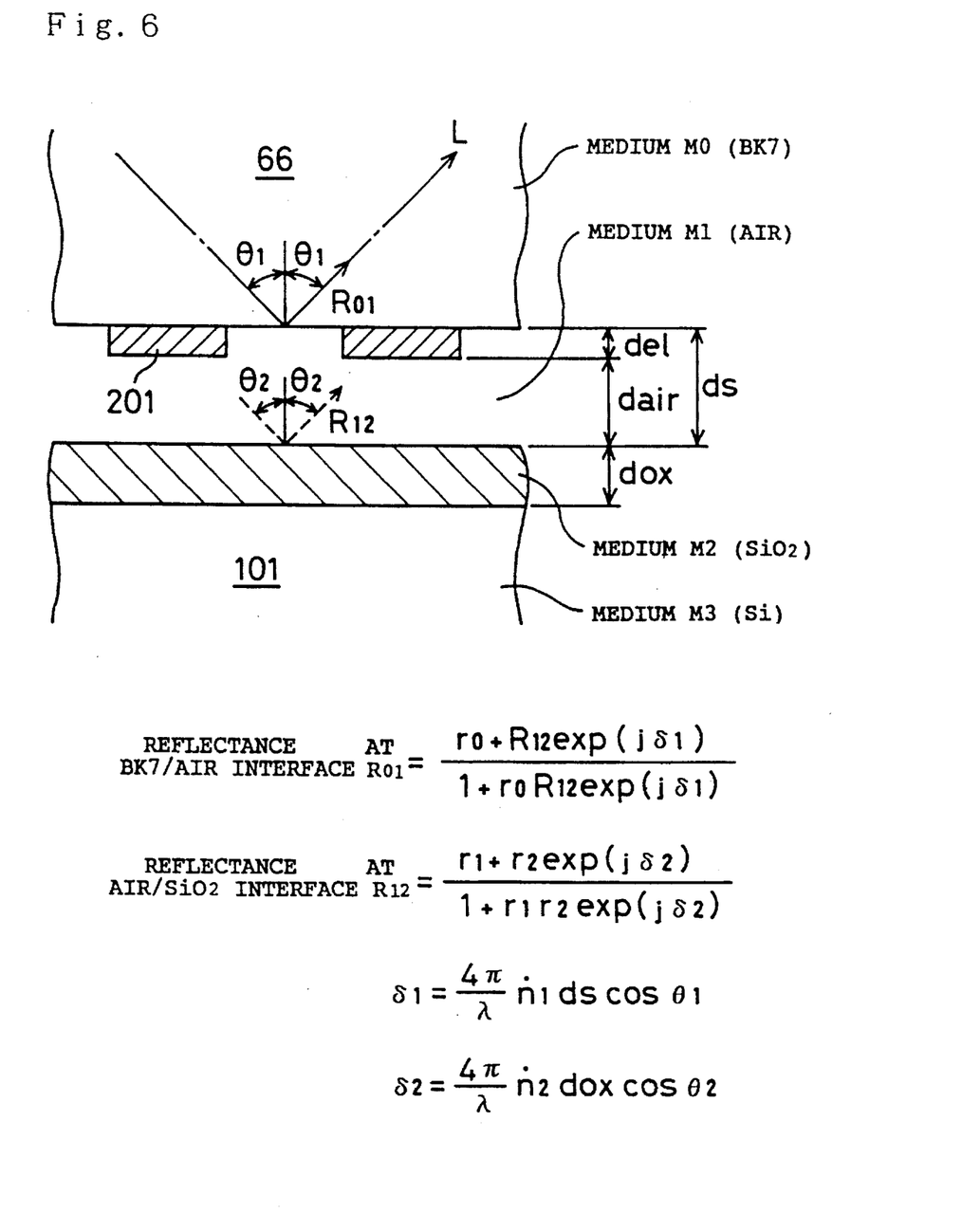
FIG. 6 is a schematic that illustrates reflection of a laser beam L at the bottom surface of a cone glass 66.

C-2. Relationship between $d_{ox}$, and $d_{air}$ obtained through measurement of reflectance of laser beam FIG. 6 schematically shows the reflection of a laser beam L at the bottom surface of the cone glass 66. The reflectance of the laser beam L is determined according to equations of multi-path reflection in an optical four-layered structure consisting of the BK7 cone glass 66 (medium M0), the air (medium M1), the oxide film 102 (medium M2), and the semi-conductor substrate 101 (medium M3). The following Equations (4a) and (4b) give a reflectance R01 at a BK7/air interface and another reflectance R12 at an air/SiO$_2$ interface, respectively:

$$R_{01} = \frac{r_0 + R_{12} \exp(j\delta_1)}{1 + r_0 R_{12} \exp(j\delta_1)} \tag{4a}$$

-continued $$R_{12} = \frac{r_1 + r_2\exp(j\delta_2)}{1 + r_1r_2\exp(j\delta_2)} \quad (4b)$$

In Equations (4a) and (4b), $r_0$, $r_1$, and $r_2$ respectively represent Fresnel coefficients of an interface of the media M0/M1, an M1/M2 interface, and an M2/M3 interface while $\delta_1$ and $\delta_2$ respectively denote phase differences between the media M0 and M1 and between the media M1 and M2, which are give by:

$$\delta_1 = \frac{4\pi}{\lambda} \dot{n}_1 d_s \cos\theta_1 = \frac{4\pi}{\lambda} \dot{n}_1 (d_{e1} + d_{air})\cos\theta_1 \quad (5a)$$

$$\delta_2 = \frac{4\pi}{\lambda} \dot{n}_2 d_{ox} \cos\theta_2 \quad (5b)$$

where $n_1$ and $n_2$ respectively denote optical constants, which are complex numbers, of the media M1 (air) and M2 ($SiO_2$), and $\theta_1$ and $\theta_2$ respectively show angles of incidence into the interface of the media M0/M1 and the interface of the media M1/M2.

The measured reflectance of a laser beam corresponds to the square of the absolute value of the reflectance R01 given by Equations (4a) and (4b). The measured value of the reflectance depends on the distance $d_s$ (=$d_{e1}$+$D_{air}$) between the cone glass 66 and the oxide film 102, and on the oxide film thickness $d_{ox}$ through Equations (5a) and (5b). In other words, the reflectance depends upon the gap $d_{air}$ and the oxide film thickness $d_{ox}$. The relationship between the gap $d_{air}$ and the oxide film thickness $d_{ox}$ is accordingly determined by substituting the measured value of the reflectance in Equations (4a), (4b), (5a) and (5b).

Figure 7:
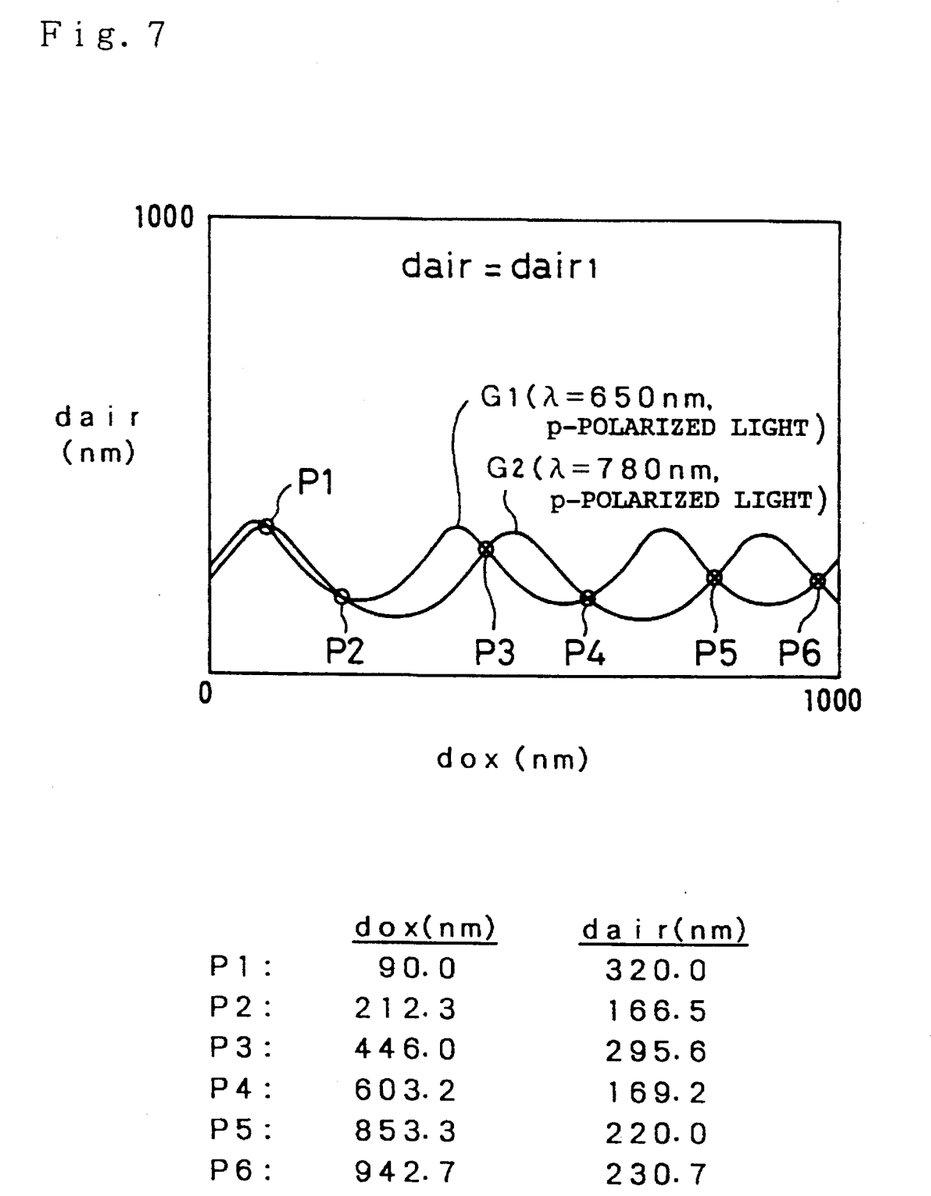
FIG. 7 is a graph showing the relationship between the gap $d_{air}$ and the oxide film thickness $d_{ox}$ obtained through measurement of the reflectance of a laser beam.

FIG. 7 is a graph showing the relationship between the gap $d_{air}$ and the oxide film thickness $d_{ox}$ obtained through measurement of the reflectance of a laser beam. The relationship between the gap $d_{air}$ and the oxide film thickness $d_{ox}$ is represented by periodical curves G1 and G2 similar to trigonometric functions. The two curves G1 and G2 respectively show the relationship obtained with p-polarized light having a wavelength of 650 nm and that obtained with p-polarized light having a wavelength of 780 nm for the same gap $d_{air}$. The two curves G1 and G2 show identical values for both of the gap $d_{air}$ and the oxide film thickness $d_{ox}$ at their intersections P1 through P6. One of these intersections shows the combination of the true gap $d_{air}$ and the true oxide film thickness $d_{ox}$. The problem here is which one is the true combination.

D. Examples of Oxide Film Thickness Measurement

Figure 8:
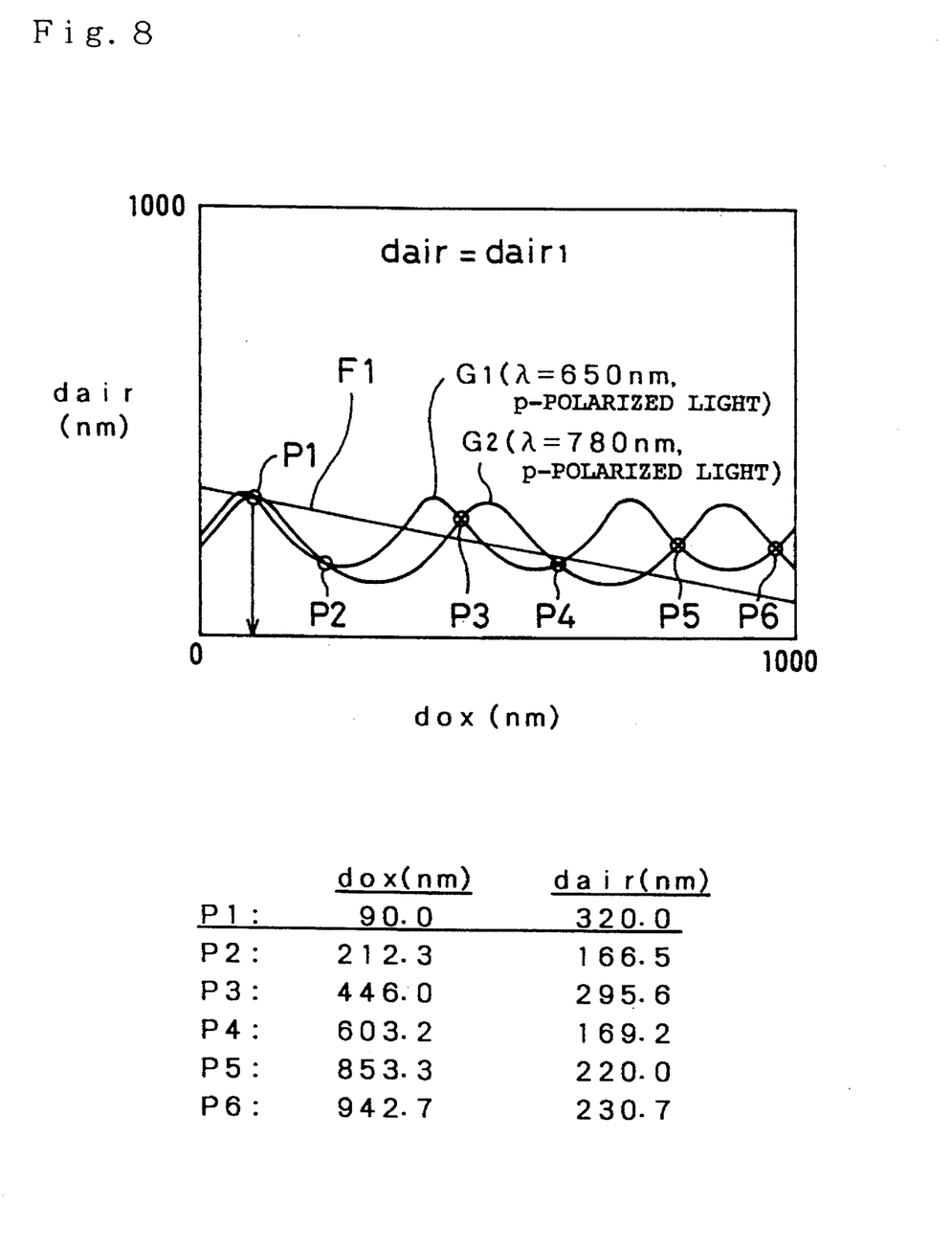
FIG. 8 is a graph showing a first method of measuring the oxide film thickness according to the present invention.

FIG. 8 is a graph showing a first method of measuring the oxide film thickness according to the present invention. In FIG. 8, the straight line F1 of FIG. 5 is drawn together with the two periodical curves G1 and G2 of FIG. 7. As described previously, the straight line F1 represents the relationship between the oxide film thickness $d_{ox}$ and the gap $d_{air}$ determined through the measurement of the total capacity $C_t$ whereas the two curves G1 and G2 show the relationships obtained through the reflectance measurement. When the three lines F1, G1, and G2 are obtained for the same value $d_{air}$ of the air gap, an intersection of the three lines F1, G1, and G2 gives the true combination of the gap $d_{air}$ and the oxide film thickness $d_{ox}$. In FIG. 8, the straight line F1 runs through the first intersection P1 of the two curves G1 and G2, and the oxide film thickness $d_{ox}$ and the gap $d_{air}$ are thereby determined to be equal to 90 nm and 320 nm, respectively.

The three lines F1, G1, and G2 may not intersect each other at one point due to measurement errors. In such a case, an intersection of the two curves G1 and G2 having the smallest distance from the straight line F1 is selected to give the true values.

As described above, a straight line representing the relationship between the gap $d_{air}$ and the oxide film thickness $d_{ox}$ is obtained from the total capacity $C_t$ in the accumulation state, which is determined by the C-V curve measurement; while two curves representing the relationship between the gap $d_{air}$ and the oxide film thickness $d_{ox}$ are obtained through the reflectance measurement with two laser beams having different wavelengths for the same gap $d_{air}$. An intersection of the straight line and the two curves gives the true oxide film thickness $d_{ox}$ and with the true gap $d_{air}$. This method is also applicable to measurement of only the gap $d_{air}$ when the value of the oxide film thickness $d_{ox}$ is not required.

Figure 9:
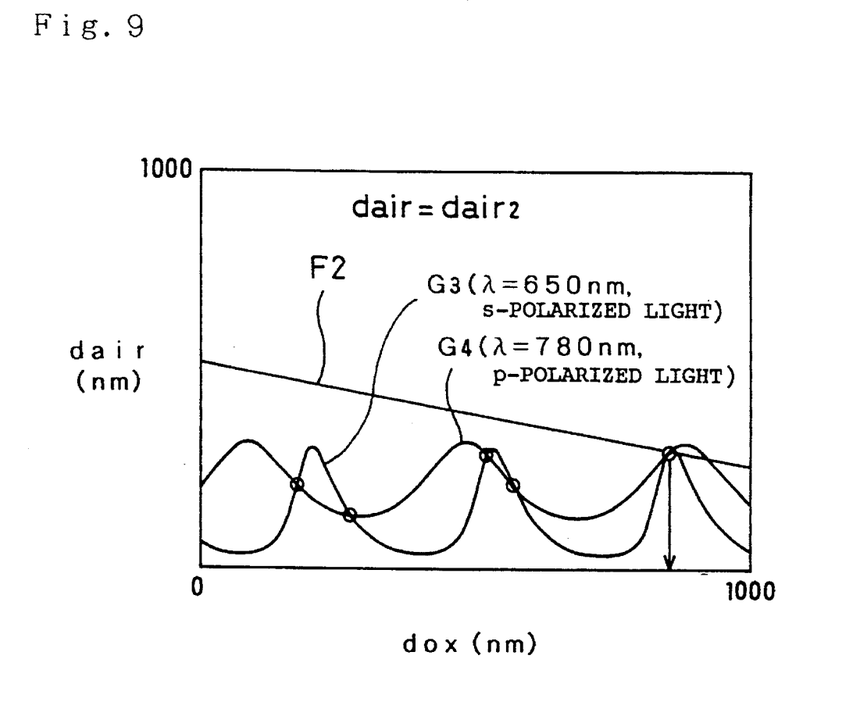
FIG. 9 is a graph showing a second method of measuring the oxide film thickness according to the present invention.

FIG. 9 is a graph showing a second method of measuring the oxide film thickness. In this method, curves G3 and G4 respectively represent the relationship obtained with spolarized light having a wavelength of 650 um and that obtained with p-polarized light having a wavelength of 780 nm. The semiconductor wafer used in the measurement of FIG. 9 has the thicker oxide film than the semiconductor wafer used in the first method shown in FIG. 8. The gap $d_{air}$ is set equal to $d_{air2}$, which is different from the value $d_{air1}$ in the first method. Two linear polarized light beams having different polarization directions and wavelengths as shown in FIG. 9 can be used in the simultaneous determination of the gap $d_{air}$ and the oxide film thickness $d_{ox}$ in the same manner as the first method shown in FIG. 8.

As clearly seen from FIGS. 8 and 9, when two laser beams have different wavelengths, the directions of polarization may be identical or different.

Figure 10:
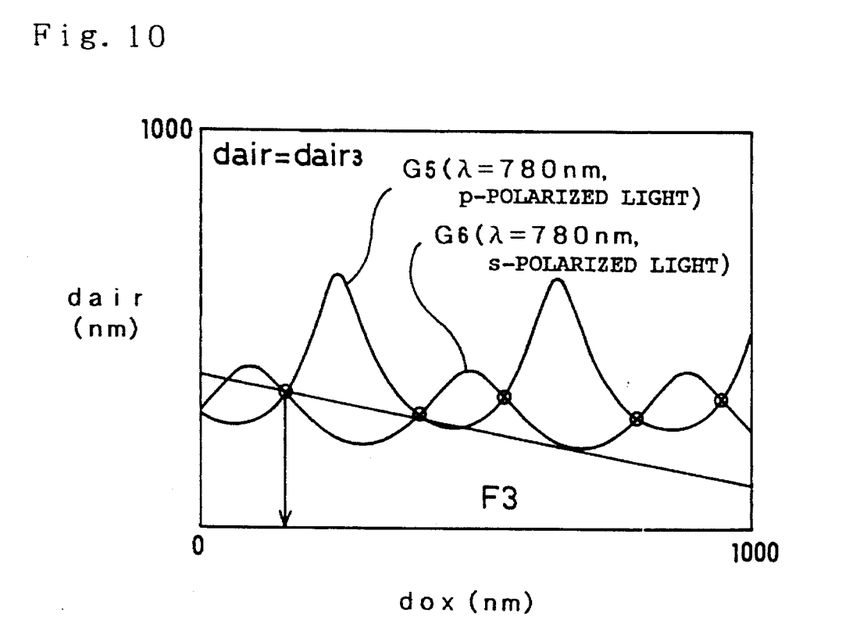
FIG. 10 is a graph showing a third method of measuring the oxide film thickness according to the present invention.

FIG. 10 is a graph showing a third method of measuring the oxide film thickness. In the third method, curves G5 and G6 respectively represent the relationship obtained with p-polarized light having a wavelength of 780 nm and that obtained with s-polarized light having the same wavelength of 780 nm. The gap $d_{air}$ is set equal to $d_{air3}$ in the measurement.

As can be seen in FIG. 10, the two curves representing the relationships between the gap $d_{air}$ and the oxide film thickness $d_{ox}$ show a phase difference of 90 degrees if two linear polarized light beams having the same wavelength and orthogonal polarization directions are used in the reflectance measurement. The method of FIG. 10 can determine intersections of the two curves at higher precision than the methods of FIGS. 8 and 9, and thereby the gap $d_{air}$ and the oxide film thickness $d_{ox}$. Although it is not required that the polarization directions of the two linear polarized light beams are orthogonal, this gives the highest precision in the thickness measurement.

Figure 11:
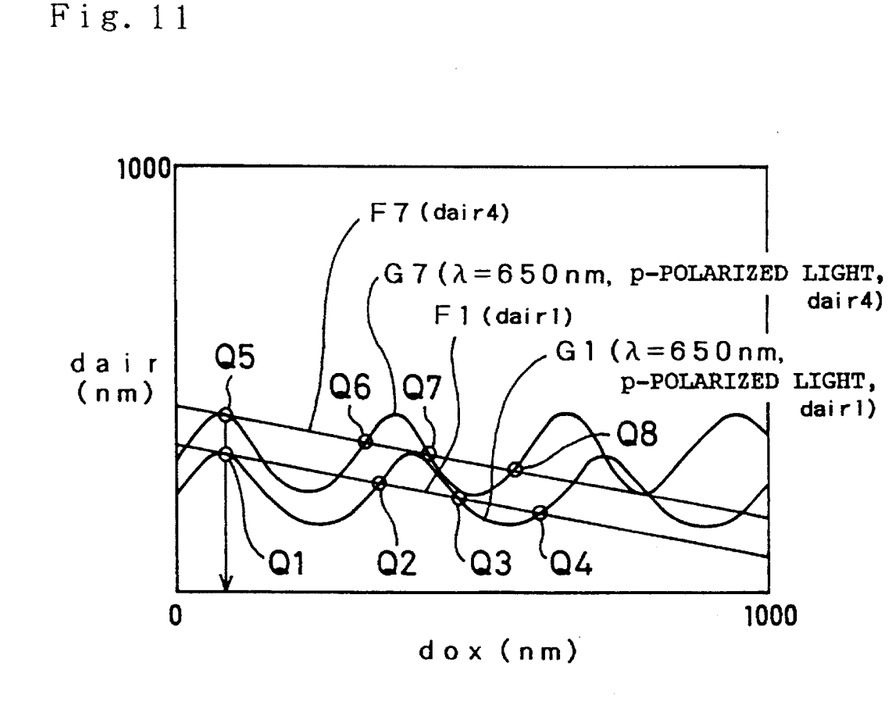
FIG. 11 is a graph showing a fourth method of measuring the oxide film thickness according to the present invention.

FIG. 11 is a graph showing a fourth method of measuring the oxide film thickness. While in the methods of FIGS. 8 through 10 the gap $d_{air}$ and the oxide film thickness $d_{ox}$ are determined from one straight line and two curves which are obtained through the C-V curve measurement and the measurement of reflectance for the same gap, the method of FIG. 11 executes both of the C-V curve measurement and the reflectance measurement for two different values of the gap $d_{air}$. The C-V curve measurement and the reflectance measurement at a first gap $d_{air}$ provide intersections Q1 through Q4 of a straight line F1 and a curve G1 whereas the measurement at a second gap $d_{air}$ provides intersections Q5 through Q8 of a straight line F7 and a curve G7. The true oxide film thickness $d_{ox}$ is determined by finding a pair of intersections Q1 and Q5 which indicate substantially identical values of the oxide film thickness $d_{o_x}$.

The method of FIG. 11 requires only one laser beam, so that one of the two laser generators 70 and 71 and one of the two photo-sensors 72 and 73 (FIG. 4(B)) can be omitted accordingly. While the method of FIG. 11 requires the C-V curve measurement and the reflectance measurement for two different gaps, on the other hand, the methods of FIGS. 8 through 10 need the measurements only for one gap. The methods of FIGS. 8 through 10 have another advantage of being able to simultaneously determine the oxide film thickness and the gap.

E. Modifications

Since there may be many other modifications, changes, and alterations without departing from the scope or spirit of essential characteristics of the present invention, it is to be clearly understood that the above embodiments are only illustrative and not restrictive in any sense. Some examples of many possible modification are given below.

(1) The reflectance measurement with three laser beams, instead of two laser beams, will determine the oxide film thickness without the C-V curve measurement. The reflectance of three laser beegive three curves respectively representing the relationships between the gap $d_{air}$ and the oxide film thickness $d_{ox}$. The gap $d_{air}$ and the oxide film thickness $d_{ox}$ are then determined from an intersection of the three curves. Three monochromatic light beams which differ in at least in wavelength and/or polarization direction can be used for determination of the oxide filmthickness through the reflectance measurement with three light beams. Possible combinations of the three light beams are:

a) three monochromatic light beams having different wavelengths;

b) three linear polarized light beams having an identical wavelength but different polarization directions; and c) two linear polarized light beams having an identical wavelength but different polarization directions, and one monochromatic light beam having a different wavelength.

(2) Semiconductor lasers for emitting linear polarized light beams like p-polarized light and s-polarized light are preferably used as a light source for of the present invention. Other light sources such as LEDs for emitting non-linear polarized light beams may, however, be used instead. In the latter case, polarizing plates are used to convert the non-linear polarized light beams to linear polarized light beams.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of measuring thickness of an insulation film formed on a surface of a semiconductor wafer, said method comprising steps of:

providing a non-destructive measuring device comprising a light source for generating a plurality of monochromatic light beams which differ at least in wavelength and/or polarization direction, an optical waveguide having a reflecting plane for reflecting said plurality of monochromatic light beams such that geometric optical total reflection of said plurality of monochromatic light beams occurs, a photosensor for measuring intensity of each of said plurality of monochromatic light beams reflected from said reflecting plane, and a test electrode proximate to said reflecting plane adapted to be used for making C-V characteristic measurement of said semiconductor wafer;

holding said reflecting plane apart from said semiconductor wafer across a gap;

emitting said plurality of monochromatic light beams from said light source, and measuring the intensity of each of said plurality of monochromatic light beams reflected from said reflecting plane to obtain reflectance of each of said plurality of monochromatic light beams;

determining a plurality of characteristic curves respectively representing relationships between the thickness of said insulation film and the gap between said reflecting plane and said semiconductor wafer by utilizing said reflectance of said plurality of monochromatic light beams;

measuring a C-V characteristic of said semiconductor wafer to obtain a total capacity of the gap and the thickness said insulation film;

determining a characteristic line representing a relationship between the gap and the thickness of the insulation film from said total capacity; and finding a common intersection where said characteristic line and said plurality of characteristic curves intersect to determine values of the gap and the thickness of the insulation film.

2. A method in accordance with claim 1, wherein said step of emitting said plurality of monochromatic light beams comprises a step wherein a first and a second of said plurality of monochromatic light beams are of different wavelengths.

3. A method in accordance with claim 1, wherein said step of emitting a plurality of monochromatic light beams comprises a step wherein a first and a second of said plurality of monochromatic light beams are linear polarized light beams having different polarization directions.

4. A method in accordance with claim 3, wherein said linear polarized light beams have orthogonal polarization directions.

5. A method in accordance with claim 4, wherein said linear polarized light beams have identical wavelengths.

6. A method of measuring thickness of an insulation film formed on a surface of a semiconductor wafer, said method comprising the steps of:

providing a non-destructive measuring device comprising a light source for generating a monochromatic light beam, an optical waveguide having a reflecting plane for reflecting said monochromatic light beam such that geometric optical total reflection of said monochromatic light beam occurs, a photosensor for measuring intensity of said monochromatic light beam reflected from said reflecting plane, and a test electrode proximate to said reflecting plane adapted to be used for making C-V characteristic measurement of said semiconductor wafer;

holding said reflecting plane apart from said semiconductor wafer across a first gap;

emitting said monochromatic light beam from said light source, and measuring the intensity of said monochromatic light beam reflected from said reflecting plane to obtain first reflectance of said monochromatic light beam;

determining a first characteristic curve representing a relationship between the thickness of said insulation film and the first gap by utilizing said first reflectance of said monochromatic light beam;

measuring a first C-V characteristic of said semiconductor wafer at said first gap to obtain a first total capacity of the first gap and the thickness of said insulation film;

determining a first characteristic line representing a relationship between the first gap and the thickness of the insulation film from said first total capacity;

holding said reflecting plane apart from said semiconductor wafer across a second gap;

emitting said monochromatic light beam from said light source, and measuring intensity of said monochromatic light beam reflected from said reflecting plane to obtain second reflectance of said monochromatic light beam;

determining a second characteristic curve representing a relationship between the thickness of said insulation film and the second gap by utilizing said second reflectance of said monochromatic light beam;

measuring a second C-V characteristic of said semiconductor wafer at said second gap to obtain a second total capacity of the second gap and the thickness of said insulation film;

determining a second characteristic line representing a relationship between the second gap and the thickness of the insulation film by utilizing said second total capacity;

finding a first intersection where said first characteristic line and said first characteristic curve intersect, and a second intersection where said second characteristic line and said second characteristic curve intersect, said first and second intersections indicating an identical value of the thickness of said insulation film, to thereby determine the value of the thickness of said insulation film.

7. A non-destructive measuring apparatus for measuring thickness of an insulation film formed on a surface of a semiconductor wafer, comprising:

a light source for generating a plurality of monochromatic light beams which differ at least in wavelength and/or polarization direction;

an optical waveguide having a reflecting plane for reflecting said plurality of monochromatic light beams such that geometric optical total reflection of said plurality of monochromatic light beams occurs;

holding means for holding said reflecting plane apart from said semiconductor wafer across a gap;

a photosensor for measuring intensity of each of said plurality of monochromatic light beams reflected from said reflecting plane to obtain reflectance of each of said plurality of monochromatic light beams;

a test electrode proximate to said reflecting plane adapted for use in making C-V characteristic measurement of said semiconductor wafer;

means for determining a plurality of characteristic curves respectively representing relationships between the thickness of said insulation film and the gap between said reflecting plane and said semiconductor wafer by utilizing said reflectance of said plurality of monochromatic light beams;

means for measuring a C-V characteristic of said semiconductor wafer to obtain a total capacity of the gap and the thickness of said insulation film;

means for determining a characteristic line representing relationship between the gap and the thickness of the insulation film by utilizing said total capacity; and means for finding a common intersection where said characteristic line and said plurality of characteristic curves intersect to determine values of the gap and the thickness of the insulation film.

8. A non-destructive measuring apparatus in accordance with claim 7, wherein said light source emits first and second monochromatic light beams having different wavelengths.

9. A non-destructive measuring apparatus in accordance with claim 7, wherein said light source emits first and second linear polarized light beams having different polarization directions.

10. A non-destructive measuring apparatus in accordance with claim 9, wherein said first and second linear polarized light beams have orthogonal polarization directions.

11. A non-destructive measuring apparatus in accordance with claim 10, wherein said first and second linear polarized light beams are of identical wavelength.

12. A non-destructive measuring apparatus for measuring thickness of an insulation film formed on a surface of a semiconductor wafer, comprising:

a light source for generating a monochromatic light beam;

an optical waveguide having a reflecting plane for reflecting said monochromatic light beam such that geometric optical total reflection of said monochromatic light beam occurs;

holding means for holding said reflecting plane apart from said semiconductor wafer across a first gap and a second gap respectively;

a photosensor for measuring intensity of said monochromatic light beam reflected from said reflecting plane at the first and the second gaps, respectively, to obtain first reflectance of said monochromatic light beam for the first gap and second reflectance of said monochromatic light beam for the second gap;

a test electrode proximate to said reflecting plane adapted for use in making C-V characteristic measurement of said semiconductor wafer;

means for determining (1) a first characteristic curve representing a relationship between the thickness of said insulation film and the first gap by utilizing said first reflectance of said monochromatic light beam, and (2) a second characteristic curve representing a relationship between the thickness of said insulation film and the second gap by utilizing said second reflectance of said monochromatic light beam;

means for measuring a first C-V characteristic of said semiconductor wafer at said first gap to obtain a first total capacity of the first gap and said insulation film, and a second C-V characteristic of said semiconductor wafer at said second gap to obtain a second total capacity of the second gap and said insulation film;

means for determining (1) a first characteristic line representing a relationship between the first gap and the thickness of the insulation film by utilizing said first total capacity, and (2) a second characteristic line representing a relationship between the second gap and the thickness of the insulation film by utilizing said second total capacity; and means for finding a first intersection where said first characteristic line and said first characteristic curve intersect, and a second intersection where said second characteristic line and said second characteristic curve intersect, said first and second intersections indicating an identical value for the thickness of said insulation film, to thereby determine the value of the thickness of said insulation film.

* * * * *